(12) United States Patent
Lee

(10) Patent No.: US 9,285,083 B2
(45) Date of Patent: Mar. 15, 2016

(54) LIGHT EMITTING DEVICE MODULE

(75) Inventor: GunKyo Lee, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 975 days.

(21) Appl. No.: 13/085,945

(22) Filed: Apr. 13, 2011

(65) Prior Publication Data

US 2011/0280012 A1 Nov. 17, 2011

(30) Foreign Application Priority Data

May 12, 2010 (KR) .................. 10-2010-0044602

(51) Int. Cl.
| F21V 9/00 | (2015.01) |
| F21S 4/00 | (2006.01) |
| F21K 99/00 | (2010.01) |
| F21V 31/00 | (2006.01) |
| H05K 3/28 | (2006.01) |
| F21Y 101/02 | (2006.01) |
| F21Y 103/00 | (2006.01) |

(52) U.S. Cl.
CPC . *F21K 9/17* (2013.01); *F21V 31/00* (2013.01); *H05K 3/281* (2013.01); *F21Y 2101/02* (2013.01); *F21Y 2103/003* (2013.01); *H01L 2224/48091* (2013.01); *H05K 2201/0125* (2013.01); *H05K 2201/10106* (2013.01)

(58) Field of Classification Search
CPC ......... F21V 31/00; F21V 31/005; F21K 9/17; F21Y 2105/001; F21Y 2101/02; F21Y 2103/003; H01L 2224/48091; H05K 2201/0125; H05K 2201/10106
USPC .................. 362/218, 227, 231, 267
See application file for complete search history.

(56) References Cited

U.S. PATENT DOCUMENTS

| 4,729,076 | A | * | 3/1988 | Masami et al. ............... 362/235 |
| 5,276,599 | A | * | 1/1994 | Neeley ........................... 362/301 |
| 5,410,328 | A | * | 4/1995 | Yoksza et al. .................... 345/82 |
| 5,412,159 | A | * | 5/1995 | Wiltgen et al. ............... 174/250 |
| 5,440,460 | A | * | 8/1995 | Melberg ........................ 362/101 |
| 6,152,590 | A | * | 11/2000 | Furst et al. ..................... 362/545 |
| 6,331,063 | B1 | * | 12/2001 | Kamada et al. ............... 362/237 |
| 6,391,686 | B1 | * | 5/2002 | Shiozawa ....................... 438/118 |
| 6,639,360 | B2 | * | 10/2003 | Roberts et al. ............... 313/512 |
| 7,192,161 | B1 | * | 3/2007 | Cleaver et al. ................ 362/260 |
| 7,618,157 | B1 | * | 11/2009 | Galvez et al. ................. 362/294 |

(Continued)

FOREIGN PATENT DOCUMENTS

| JP | P 2004-207341 | 7/2004 |
| JP | U 3120714 | 3/2006 |

(Continued)

OTHER PUBLICATIONS

European Search Report dated Aug. 28, 2013 issued in Application No. 11 16 1815.

(Continued)

*Primary Examiner* — Stephen F Husar
(74) *Attorney, Agent, or Firm* — Ked & Associates, LLP

(57) ABSTRACT

A light emitting device module is provided comprising a light emitting device package, a printed circuit board on which the light emitting device package is arranged and a sealing member that surrounds the light emitting device package and the printed circuit board, wherein a predetermined space is formed between the light emitting device package and the printed circuit board and the sealing member.

20 Claims, 5 Drawing Sheets

(56) References Cited

U.S. PATENT DOCUMENTS

| | | | |
|---|---|---|---|
| 7,736,016 B2* | 6/2010 | Suehiro et al. | 362/218 |
| 7,810,954 B2* | 10/2010 | Kolodin | 362/277 |
| 7,889,421 B2* | 2/2011 | Narendran et al. | 359/326 |
| 8,047,674 B2* | 11/2011 | Liu | 362/218 |
| 8,272,764 B2* | 9/2012 | Son | 362/294 |
| 8,348,460 B2* | 1/2013 | Bachl et al. | 362/249.01 |
| 8,376,576 B2* | 2/2013 | Sloan et al. | 362/249.02 |
| 8,556,452 B2* | 10/2013 | Simon et al. | 362/217.07 |
| 2001/0055827 A1* | 12/2001 | Asakura et al. | 438/30 |
| 2002/0043704 A1* | 4/2002 | Seko | 257/678 |
| 2003/0090892 A1* | 5/2003 | Su | 362/101 |
| 2003/0090910 A1* | 5/2003 | Chen | 362/555 |
| 2003/0197297 A1* | 10/2003 | Berk et al. | 264/40.6 |
| 2004/0113550 A1 | 6/2004 | Adachi et al. | 313/512 |
| 2004/0239864 A1* | 12/2004 | Asakawa | 349/153 |
| 2005/0040762 A1* | 2/2005 | Kurihara | 313/512 |
| 2005/0117356 A1 | 6/2005 | Lin | 362/456 |
| 2005/0122293 A1* | 6/2005 | Wang | 345/84 |
| 2005/0155792 A1* | 7/2005 | Ito et al. | 174/264 |
| 2005/0270774 A1* | 12/2005 | Pan | 362/217 |
| 2006/0097245 A1* | 5/2006 | Aanegola et al. | 257/26 |
| 2006/0102991 A1* | 5/2006 | Sakano | 257/678 |
| 2006/0227537 A1* | 10/2006 | Vanderschuit | 362/154 |
| 2007/0058357 A1* | 3/2007 | Yamaguchi et al. | 362/84 |
| 2008/0128739 A1* | 6/2008 | Sanpei et al. | 257/99 |
| 2008/0310156 A1* | 12/2008 | Wang | 362/231 |
| 2010/0078483 A1* | 4/2010 | Liu et al. | 235/462.42 |
| 2010/0177532 A1* | 7/2010 | Simon et al. | 362/555 |
| 2010/0246176 A1* | 9/2010 | Shyu et al. | 362/235 |
| 2011/0038144 A1* | 2/2011 | Chang | 362/218 |
| 2011/0051409 A1* | 3/2011 | Nearman | 362/231 |
| 2011/0051415 A1* | 3/2011 | Chen et al. | 362/235 |
| 2012/0182755 A1* | 7/2012 | Wildner | 362/555 |
| 2012/0235181 A1* | 9/2012 | Matsuda et al. | 257/88 |

FOREIGN PATENT DOCUMENTS

| | | |
|---|---|---|
| JP | 2007-36132 A | 2/2007 |
| JP | 2009-267039 A | 11/2009 |
| JP | 2010-10437 A | 1/2010 |
| JP | 2010-103355 A | 5/2010 |

OTHER PUBLICATIONS

Chinese Office Action dated Apr. 16, 2013 issued in Application No. 201110123788.1 (with English translation).

Japanese Office Action issued in Application No. 2011-107365 dated Aug. 3, 2015.

Japanese Office Action issued in related Application No. 2011-107365 dated Mar. 31, 2015.

* cited by examiner

LIGHT EMITTING DEVICE MODULE

CROSS-REFERENCE TO RELATED APPLICATION

This application claims the priority benefit of Korean Patent Application No. 10-2010-0044602, filed on May 12, 2010 in the Korean Intellectual Property Office, the disclosure of which is incorporated herein by reference.

BACKGROUND OF THE EMBODIMENT

1. Technical Field

Embodiments are directed to a light emitting device module including a light emitting device package and a printed circuit board, which prevents corrosion of the light emitting device package or printed circuit board that may occur due to inflow of moisture into the printed circuit board or light emitting device package.

2. Discussion of the Related Art

Light emitting diodes are semiconductor devices that convert electrical energy into light. Light emitting diodes draw attention as alternatives to existing light sources, such as fluorescent lamps or incandescent lamps, by virtue of low power consumption, a long lifespan, a rapid response, and eco-friendly characteristics.

A need exists to replace the existing light sources by Light emitting diodes and to improve color rendition and light-diffusing characteristics of the Light emitting diodes.

SUMMARY OF THE EMBODIMENT

Embodiments provide a light emitting device module that prevents corrosion caused by inflow of moisture into a printed circuit board and a light emitting device package.

According to an embodiment, there is provided a light emitting device module comprising a light emitting device package, a printed circuit board on which the light emitting device package is arranged, and a sealing member that surrounds the light emitting device package and the printed circuit board, wherein a predetermined space is formed between the light emitting device package and the printed circuit board and the sealing member.

According to an embodiment, the heat shrink able sealing member surrounds the light emitting device packages and the printed circuit board to prevent corrosion of the light emitting device packages and the printed circuit board that may occur due to infiltration of moisture.

The sealing member that may be formed of a transparent material or material having various colors may have various applications, such as illumination for refrigerators.

DETAILED DESCRIPTION OF THE EXEMPLARY EMBODIMENTS

Figure 1:
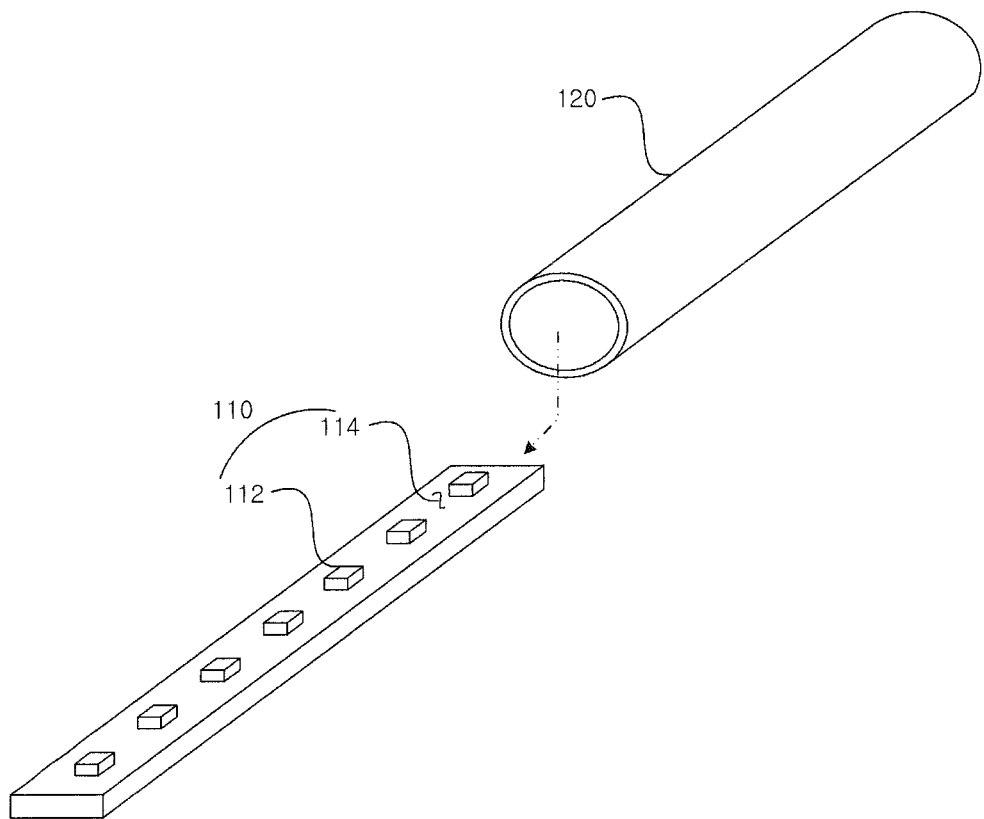
FIG. 1 is a perspective view illustrating a light emitting device module according to an embodiment.

Hereinafter, exemplary embodiments will be described in detail with reference to the accompanying drawings, wherein the same reference numerals are used to denote the same or substantially the same elements throughout the specification and the drawings. In the drawings, it will be understood that when a layer (or film, region, pattern, or substrate) is referred to as being 'on' or 'under' another layer (or film, region, pattern, or substrate), it can be directly on or under the other layer (or film, region, pattern, or substrate), or intervening layers may also be present.

In the drawings, the dimensions, such as sizes or thicknesses, of layers or films are exaggerated, omitted, or schematically shown for clarity of illustration. Accordingly, the sizes of the elements in the drawings do not thoroughly reflect real sizes of elements.

Angles and directions described herein are based on those shown in the drawings. Reference points of angles and locations of light emitting device package array structures, which are not clearly described herein, are based on those shown in the drawings.

Figure 2:
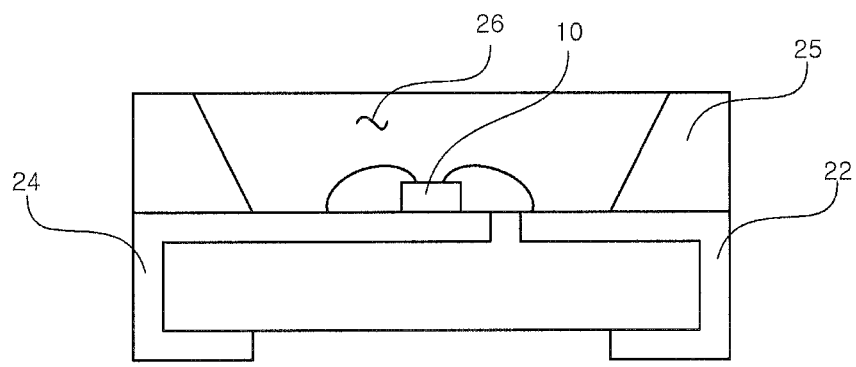
FIG. 2 is a cross section view illustrating a light emitting device package shown in FIG. 1 according to an embodiment.

FIG. 1 is a perspective view illustrating a light emitting device module according to an embodiment, and FIG. 2 is a cross section view illustrating a light emitting device package shown in FIG. 1 according to an embodiment.

Referring to FIGS. 1 and 2, the light emitting device module 100 includes light emitting device packages 112, a printed circuit board 114 on which the light emitting device packages 112 are arranged, and a sealing member 120 that seals the light emitting device packages 112 and the printed circuit board 114.

Each of the light emitting device packages 112 includes a light emitting device 10 and a body 25 in which the light emitting device 10 is arranged.

First and second electrodes 22 and 24 are arranged at the body 25 to supply electricity from an external power source (not shown) to the light emitting device 10.

The body 25 may be formed of at least one of a resin, such as polyphthalamide (PPA), silicon (Si), aluminum (Al), aluminum nitride (AIN), AlOx, Liquid Crystal Polymer (PSG, photosensitive glass), polyamide 9T (PA9T), syndiotactic polystyrene (SPS), metal, sapphire ($Al_2O_3$), beryllium oxide (BeO), or a printed circuit board (PCB).

The body 25 may be formed by, but not limited to, injection molding or etching.

The first and second electrodes 22 and 24 may be formed of a metal, for example, one or more or an alloy of titanium (Ti), copper (Cu), nickel (Ni), gold (Au), chrome (Cr), tantalum (Ta), platinum (Pt), tin (Sn), silver (Ag), phosphorous (P), aluminum (Al), indium (In), palladium (Pd), cobalt (Co), silicon (Si), germanium (Ge), hafnium (Hf), ruthenium (Ru), or iron (Fe). The first and second electrodes 22 to 24 may have, but not limited to, a single layer or a multilayer structure.

According to an embodiment, the body 25 may be formed of a metallic material, and an insulation film may be formed on a surface of the body 25 to prevent the body 25 from form a short circuit with the first and second electrodes 22 and 24.

An upper portion of the body 25 may have various shapes, such as a triangle, a rectangle, a polygon, or a circle, depending on use and design of the light emitting device packages.

The body 25 has a cavity 26 in which the light emitting device 10 is positioned. The cavity 26 may have a cross section of a cup shape or a concave vessel, and an inner surface of the cavity 26 may be perpendicular to a lower portion of the cavity 26 or inclined with respect to a line perpendicular to the lower portion.

A plane surface of the cavity 26 may have a shape such as, but not limited to, a circle, a rectangle, a polygon, or an ellipse.

The light emitting device 10 may be electrically connected to the first and second electrodes 22 and 24 by wire bonding.

According to an embodiment, when the light emitting device 10 is a horizontal-type light emitting device chip, the light emitting device 10 may be electrically connected to the first and second electrodes 22 and 24 by metal lines.

According to an embodiment, when the light emitting device 10 is a vertical-type light emitting device which is mounted on the second electrode 24, the light emitting device 10 may be wire-bonded to the first electrode 22 but not to the second electrode 24.

According to an embodiment, when the light emitting device 10 is a flip-type light emitting device, the light emitting device 10 may be electrically connected to the first and second electrodes 22 and 24 by a die bonding method.

According to an embodiment, a sealant (not shown) may be filled in the cavity 26 to cover the light emitting device 10.

The printed circuit board 114 may be any one of an epoxy substrate, a metallic substrate, and a ceramic substrate, and includes first and second copper patterns (not shown) that electrically contact the first and second electrodes 22 and 24, respectively.

When the light emitting device package 112 is mounted on the first and second copper patterns, electricity is supplied from an external power source (not shown) through the first and second copper patterns to the light emitting device package 112.

The sealing member 120 seals the printed circuit board 114 and the light emitting device packages 112 arranged on the printed circuit board 114.

According to an embodiment, the sealing member 120 may be a tube that shrinks by heat, that is, a heat shrinkable tube, and may include a transparent or colored material.

The sealing member 120 may prevent corrosion that may occur due to moisture infiltrating into a space between the first and second electrodes 22 and 24 formed at two side surfaces of the body 25 and the first and second copper patterns of the printed circuit board 114.

When the printed circuit board 114 is a metallic substrate, the sealing member 120 may also prevent the printed circuit board 114 from being corroded.

As shown in FIG. 1, a plurality of light emitting device packages 112 are mounted on the printed circuit board 114. However, according to an embodiment, a single light emitting device package 112 may also be mounted on the printed circuit board 114.

According to an embodiment, when the plurality of light emitting device packages 112 arranged on the printed circuit board 114 are divided into two groups, the sealing member 120 may separately seal each of the two groups.

According to an embodiment, when the plurality of light emitting device packages 112 are divided into at least three groups, the sealing member 120 may seal only two groups positioned at both ends of the printed circuit board 114.

For example, the light emitting device module 100 begins to be corroded by moisture contained in air flowing through both ends of the light emitting device module 100, and accordingly, some of the light emitting device packages 112 located at both ends of the printed circuit board 114 may be first sealed.

According to an embodiment, the sealing member 120 may seal only some of the light emitting device packages 112 mounted on the printed circuit board 114.

For example, the sealing member 120 may seal the light emitting device packages 112 other than the light emitting device packages 112 located at both ends of the printed circuit board 114, especially light emitting device packages 112 more frequently contacting air.

The light emitting device packages 112 to be sealed by the sealing member 120 may depend on where the light emitting device module 100 is to be located.

According to an embodiment, the sealing member 120 include a film containing various colors of phosphors in an inner surface that contacts the light emitting device packages 112.

Figure 3:
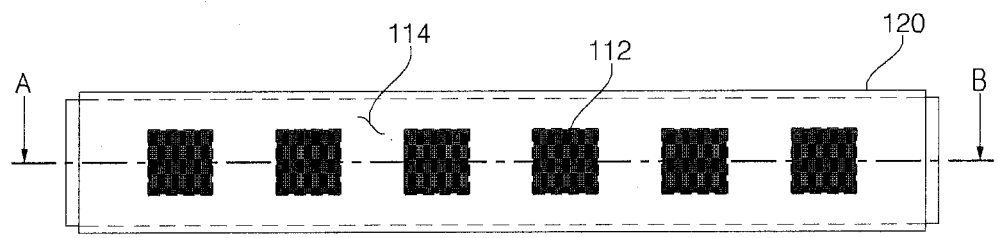
FIG. 3 is a plan view illustrating a light emitting device module according to an embodiment.
Figure 4:
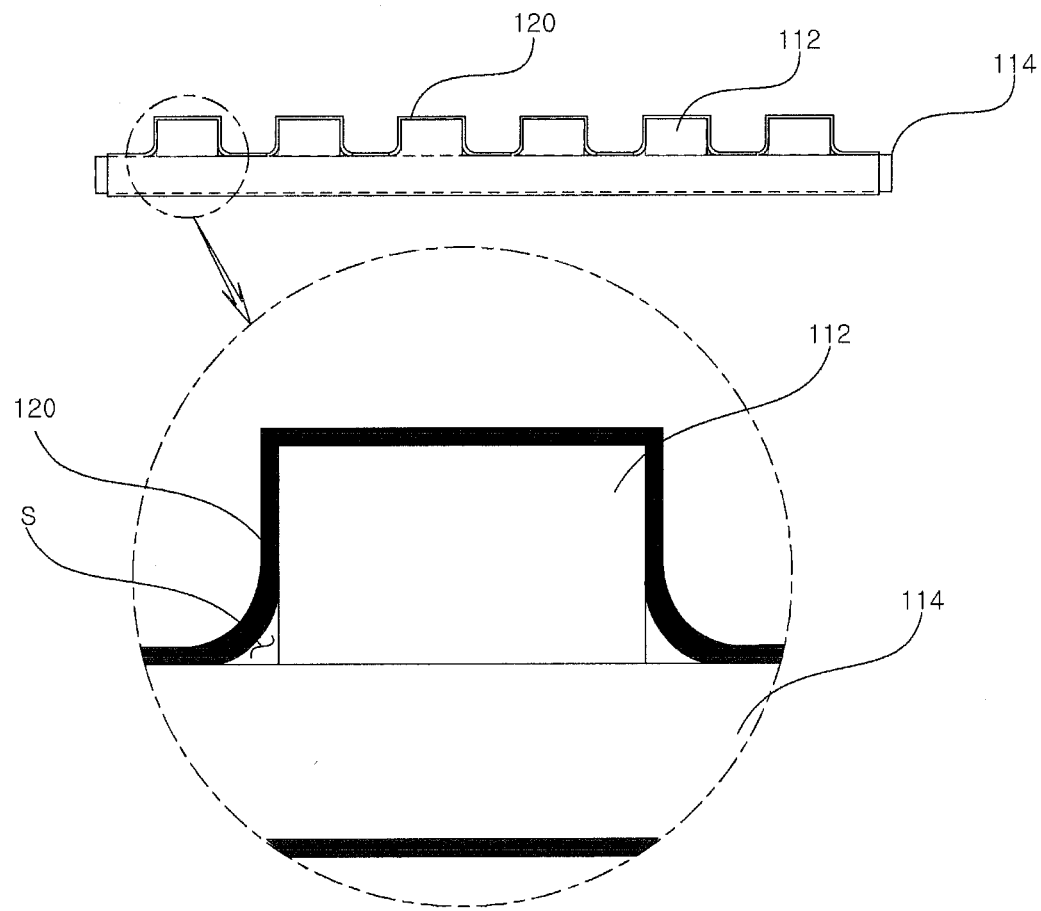
FIG. 4 is a cross section view taken along line A-B of FIG. 3.

FIG. 3 is a plan view illustrating a light emitting device module according to an embodiment, and FIG. 4 is a cross section view taken along line A-B of FIG. 3.

Referring to FIGS. 3 and 4, the light emitting device module 100 includes a plurality of light emitting device packages 112, a light emitting device package 114 on which the plurality of light emitting device packages 112 are arranged, and a sealing member 120 that seals the light emitting device packages 112 and the light emitting device package 114.

The sealing member 120 surrounds the light emitting device packages 112 and the printed circuit board 114 and then is placed in a chamber (not shown). The sealing member 120 placed in the chamber shrinks by heat generated in the chamber.

As a result, the sealing member 120 seals the light emitting device packages 112 and the printed circuit board 114 to prevent inflow of air or moisture.

Although it has been illustrated in FIG. 3 that the sealing member 120 has a shorter length than that of the printed circuit board 114, the sealing member 120 may have the same length as that of the printed circuit board 114.

Referring to FIG. 4, predetermined spaces S are formed between the light emitting device packages 112 and the printed circuit board 114 and the sealing member 120.

The spaces S are formed at corners of the light emitting device packages 112 which are adjacent to the printed circuit board 114 when the sealing member 120 experiences thermal shrinkage in the chamber. The spaces S are maintained in air.

The sealing member 120 has a rounded portion near a corner of the light emitting device packages 112 which is adjacent to the printed circuit board 114, wherein the rounded portion has a curvature.

Namely, the sealing member 120 includes a first surface (not shown) contacting the light emitting device packages 112 and the printed circuit board 114, and a second surface (not shown) opposite to the first surface, the second surface exposed to an outside, wherein the first surface has a first curvature and the second surface has a second curvature.

The first curvature is the same as the second curvature.

The sealing member 120 prevents corrosion of metallic or conductive materials, such as the electrodes or copper patterns formed in the printed circuit board 114 or light emitting device packages 112, which is caused by air or moisture that flows in the light emitting device packages 112 or the printed circuit board 114.

Also, the sealing member 120 prevents the light emitting device packages 112 and the printed circuit board 114 from being damaged by external shocks.

Figure 5:
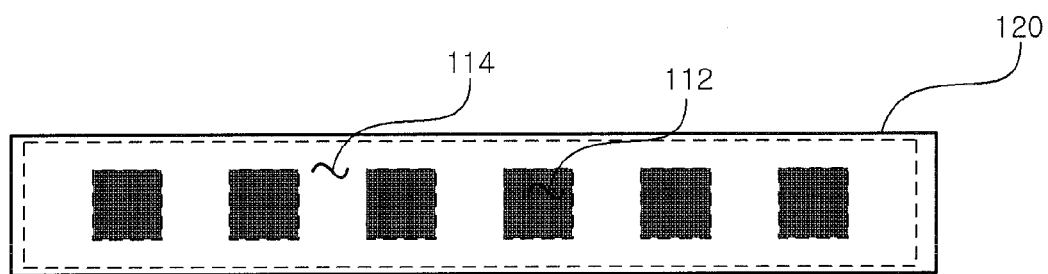
FIGS. 5 to 7 are plan views illustrating a light emitting device module according to embodiments.
Figure 6:
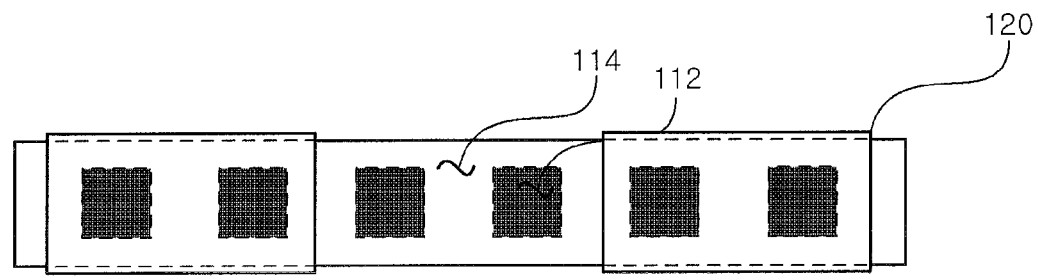
Figure 7:
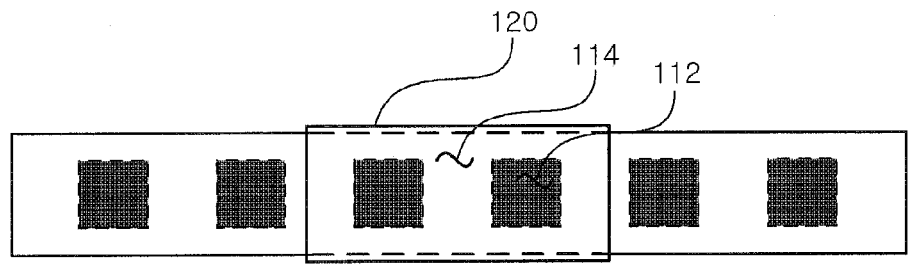

FIGS. 5 to 7 are plan views illustrating a light emitting device module according to embodiments.

In FIGS. 5 to 7, the same parts as those described in connection with FIGS. 3 and 4 will be briefly described or their detailed description will not be repeated.

Referring to FIG. 5, the sealing member 120 has a length longer than the printed circuit board 114, and seals the entirety of the printed circuit board 114 on which the light emitting device packages 112 are arranged.

By doing so, the sealing member 120 may substantially block inflow of air. Although the sealing member 120 is subjected to thermal shrinkage, the sealing member 120 may fail to completely seal both ends of the printed circuit board 114.

The sealing member 120 as shown in FIG. 6 or 7 seals only a part of the printed circuit board 114.

Referring to FIG. 6, the sealing member 120 seals both end portions of the printed circuit board 114.

Generally, the printed circuit board 114 is prevent the inflow of air by the case than being exposed to air.

The both end portions of the printed circuit board 114 may be more easily corroded than the remaining portion of the printed circuit board 114.

Accordingly, as shown in FIG. 6, only the both end portions of the printed circuit board 114 may be sealed by the sealing member 120.

Referring to FIG. 7, the sealing member 120 seals a central portion of the printed circuit board 114 rather than the two end portions of the printed circuit board 114.

The light emitting device packages 112 located near the central portion of the printed circuit board 114 may be important in terms of luminance efficiency of an illumination device or a backlight device. The sealing member 120 seals the central portion of the printed circuit board 114 to prevent damage to the light emitting device packages 112 adjacent to the central portion.

According to the embodiments, the light emitting device module may prevent impacts or moisture infiltration from the outside, thus enhancing reliability and life span of the light emitting device packages and the printed circuit board.

Figure 8:
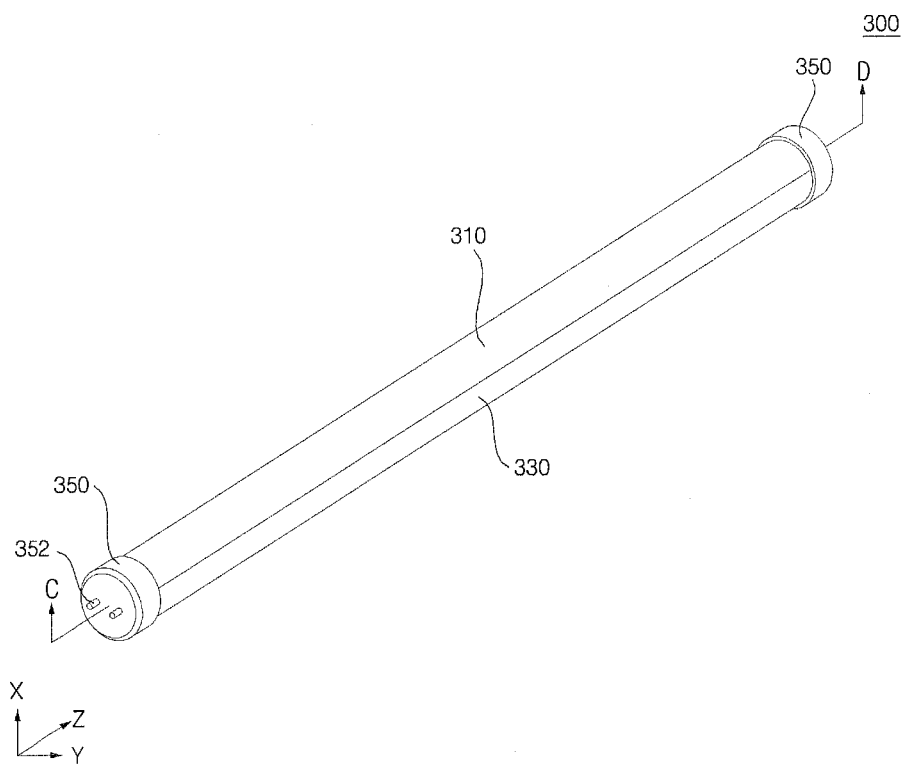
FIG. 8 is a perspective view illustrating an illumination device having a light emitting device module according to an embodiment.
Figure 9:
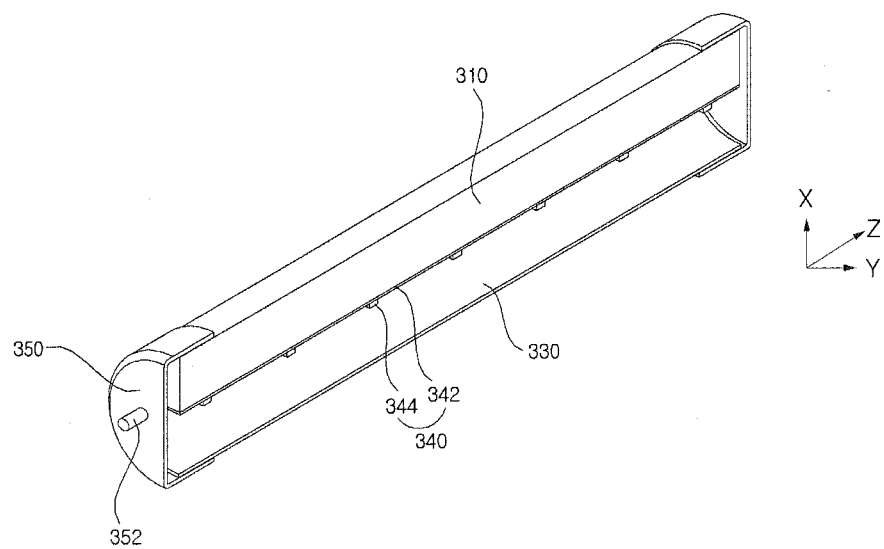
FIG. 9 is a cross section view taken along line C-D of FIG. 8.

FIG. 8 is a perspective view illustrating an illumination device having a light emitting device module according to an embodiment. FIG. 9 is a cross section view taken along line C-D of FIG. 8.

FIG. 9 illustrates a cross section obtained by cutting the illumination device 300 with respect to a plane defined by a lengthwise direction Z and a height direction X.

Referring to FIGS. 8 and 9, the illumination device 300 includes a body 310, a cover 330 coupled to the body 310, and sealing caps 350 positioned at both ends of the body 310.

A light emitting device module 340 is positioned at a lower surface of the body 310. The body 310 is formed of a metal having good thermal conductivity and heat diffusing effects so that heat generated from a plurality of light emitting device packages 344 may be dissipated through an upper surface of the body 310 to the outside.

The illumination device 300 may include the light emitting device module shown in FIG. 1 or 7.

The plurality of light emitting device packages 344 having various colors may be arranged in various rows on a printed circuit board 342. According to embodiments, the light emitting device packages 344 may be spaced apart from one another by the same or different distances to adjust brightness of light. The printed circuit board 342 may be made of metal to effectively dissipate heat.

Since the entire bottom surface of the printed circuit board 342 is brought in contact with the body 310, heat generated from the light emitting device packages 344 may be effectively conducted to the body 310.

The cover 330 may be formed to have a rounded shape that surrounds a lower surface of the body 310, but not limited to the shape.

The cover 330 protects the light emitting device module 340 from outside unwanted materials. The cover 330 may include light diffusing particles that prevent a user from being dazzled by light emitted from the light emitting device packages 344 and that enable light to be evenly directed to the outside. According to an embodiment, a prism pattern may be formed on at least one of an inner surface and an outer surface of the cover 330.

Light generated from the light emitting device packages 344 is exited to the outside through the cover 330. Accordingly, the cover 330 has good light transmittance and thermal resistance sufficient to endure heat generated from the light emitting device packages 344. According to embodiments, the cover 330 may include polyethylenterephthalate (PET), polycarbonate (PC), or polymethylmethacrylate (PMMA).

The sealing caps 350 are positioned at both ends of the body 310 and seal a power control module (not shown). The sealing caps 350 include pins 352 similar to pins included in an existing fluorescent lamp so that the illumination device 300 may be used instead of the fluorescent lamp without additional devices.

Figure 10:
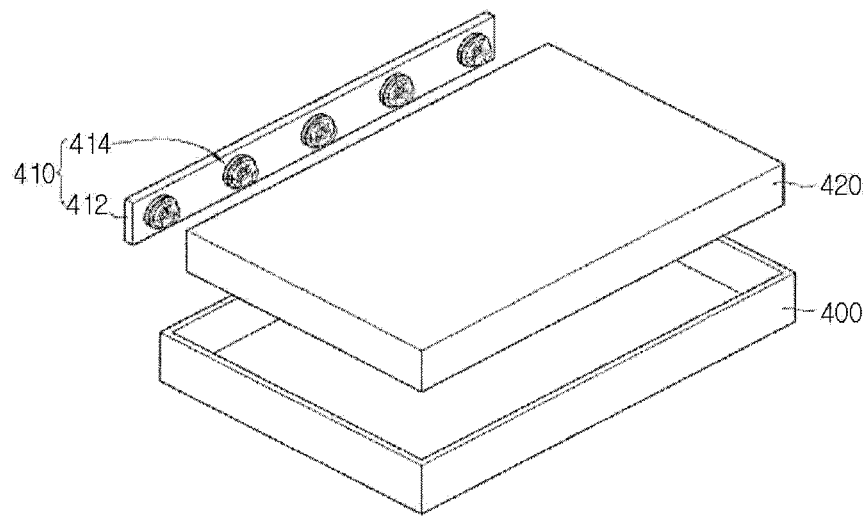
FIG. 10 is a perspective view illustrating a backlight device including a light emitting device module according to an embodiment.

FIG. 10 is a perspective view illustrating a backlight device including an LED array according to an embodiment.

FIG. 10 illustrates an edge-type backlight device. Referring to FIG. 10, the backlight device includes a lower receiving member 400, a light emitting device module 410 that emits light, a light guide plate 420 that is arranged adjacent to the light emitting device module 410, and a plurality of optical sheets (not shown). The plurality of optical sheets (not shown) may be located on the light guide plate 420, and may be the same as a plurality of optical sheets 530 shown in FIG. 11.

The light emitting device module 410 includes a printed circuit board 412 and a plurality of light emitting device packages 414 that are arranged on the printed circuit board 412 to form an array. The printed circuit board 412 may include a metal core printed circuit board (MCPCB) or a printed circuit board formed of FR4. The printed circuit board 412 may be shaped as a rectangular plate, and according to embodiments, may have various shapes depending on the structure of the backlight device.

The light guide plate 420 guides light emitted from the light emitting device packages 414 toward an LCD panel (not shown). The plurality of optical sheets (not shown) may be positioned on a front surface of the light guide plate 420 to provide a uniform brightness distribution and enhanced vertical incidence for light coming from the light guide plate 420. Also, a reflection sheet (not shown) may be located on a rear surface of the light guide plate 420 to reflect light toward the light guide plate 420.

Figure 11:
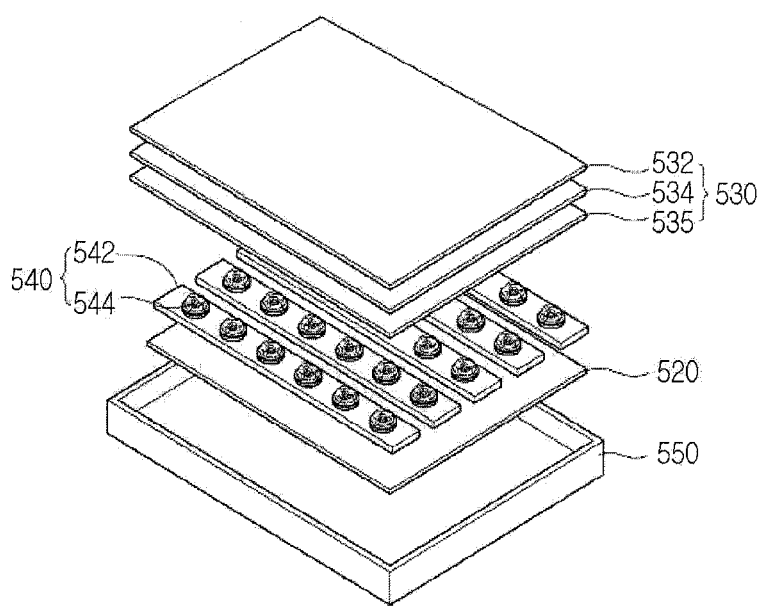
FIG. 11 is a perspective view illustrating a backlight device including a light emitting device module according to an embodiment.

FIG. 11 is a perspective view illustrating a backlight device including a light emitting device module according to an embodiment.

FIG. 11 illustrates a vertical-type backlight device. Referring to FIG. 11, the backlight device includes a lower receiving member 550, a reflecting plate 520, a plurality of a light emitting device modules 540, and a plurality of optical sheets 530.

Each of the a light emitting device modules 540 includes a printed circuit board 542 and a plurality of light emitting device packages 544 that are arranged on the printed circuit board 542 to form an array.

The reflecting plate 520 includes a plate having high reflectivity and may reduce light loss. The optical sheets 530 may include at least one of a brightness enhancing sheet 532, a prism sheet 534, and a diffusing sheet 535.

The diffusing sheet 535 directs light emitted from the light emitting device packages 544 toward a liquid crystal display (LCD) panel (not shown) and diffuses the light to have a uniform distribution over a broad area. The prism sheet 534 allows light inclinedly coming to be perpendicularly exited. For example, at least one prism sheet 534 may be arranged under the liquid crystal display LCD panel (not shown) to direct light coming from the diffusing sheet 535 in an orthogonal direction. The brightness enhancing sheet 532 transmits light beams that travel in a direction parallel to its transmittance axis and reflects light beams that travel in a direction perpendicular to the transmittance axis.

According to an embodiment, the vertical-type backlight device shown in FIG. 11 may be used in conjunction with the edge-type backlight device shown in FIG. 10.

The illumination device 300 and the backlight devices may be included in a lighting system. Further, any devices for illumination, including the light emitting device module, may be included in the lighting system.

The embodiment has been explained above with reference to characteristic. It will be evident to those skilled in the art that various modifications may be made thereto without departing from the broader spirit and scope of the embodiment. Further, although the embodiment has been described in the context its implementation in particular environments and for particular applications, those skilled in the art will recognize that the present embodiments usefulness is not limited thereto and that the embodiment can be beneficially utilized in any number of environments and implementations. The foregoing description and drawings are, accordingly, to be regarded in an illustrative rather than a restrictive sense.

What is claimed is:

1. A light emitting device module comprising:
a light emitting device package having an upper surface and a lateral surface;
a printed circuit board on which the light emitting device package is arranged; and
a sealing member that surrounds the light emitting device package and the printed circuit board, the sealing member being a sheet,
wherein the sealing member directly contacts the upper surface and an upper portion of the lateral surface and extends downward while directly contacting the lateral surface of the light emitting device package, and
wherein the sealing member extends from the upper portion of the lateral surface of the light emitting device package to a surface of the printed circuit board between the light emitting device package and another light emitting device package at a prescribed distance from a lower portion of the light emitting device package to form a prescribed space between the light emitting device package, the printed circuit board and the sealing member.

2. The light emitting device module of claim 1, wherein the prescribed space is filled with air.

3. The light emitting device module of claim 1, wherein the prescribed space is formed at a corner formed between the light emitting device package and the printed circuit board.

4. The light emitting device module of claim 1, wherein the sealing member surrounds an upper surface of the printed circuit board on which the light emitting device package is arranged and a bottom surface of the printed circuit board.

5. The light emitting device module of claim 4, wherein the the sealing member is provided to seal both ends of the printed circuit board or a central portion of the printed circuit board.

6. The light emitting device module of claim 1, wherein a plurality of light emitting device packages are arranged on the printed circuit board in a series connection or parallel connection, and
wherein the sealing member seals at least two light emitting devices from a first light emitting device package to a last light emitting device package among the plurality of light emitting device packages arranged on the printed circuit board.

7. The light emitting device module of claim 1, wherein the sealing member is formed of a transparent material.

8. The light emitting device module of claim 1, wherein the sealing member is formed of a colored material.

9. The light emitting device module of claim 1, wherein the sealing member has a rounded portion near a corner of the light emitting device package which is adjacent to the printed circuit board, wherein the rounded portion has a curvature.

10. The light emitting device module of claim 9, wherein the sealing member includes
a first surface contacting the light emitting device package and the printed circuit board, and
a second surface opposite to the first surface, the second surface exposed to an outside,
wherein the first surface has a first curvature and the second surface has a second curvature.

11. The light emitting device module of claim 10, wherein the first curvature of the first surface is the same as the second curvature of the second surface.

12. The light emitting device module of claim 1, wherein the sealing member has a length longer than the printed circuit board.

13. The light emitting device module of claim 1, wherein the sealing member contains various colors of phosphors.

14. The light emitting device module of claim 1, wherein the sealing member is formed of a material that contracts in response to heat, the sheet being configured to contract from a tubular shape to surround the light emitting device package and the printed circuit board.

15. The light emitting device module of claim 1, wherein a portion of the sealing member extends at a prescribed curvature from the lateral surface of the light emitting device package to the surface of the printed circuit board to form the prescribed space.

16. The light emitting device module of claim 1, wherein the sealing member contacts the surface of the printed circuit board around the light emitting device packages to seal the light emitting device package.

17. The light emitting device module of claim 16, wherein a plurality of the light emitting device packages are provided on the printed circuit board, and the sealing member contacts the surface of the printed circuit board around prescribed ones of the plurality of light emitting device packages to seal each of the prescribed ones of the light emitting device packages.

18. The light emitting device module of claim 1, wherein the printed circuit board is provided in an enclosure for an illumination device, the enclosure having a tubular shape and the sealing member being provided a prescribed distance from an inner surface of the enclosure.

19. A lighting system comprising:

a light emitting device module that includes a light emitting device package having an upper surface and a lateral surface, a printed circuit board on which the light emitting device package is arranged and a sealing member that surrounds the light emitting device package and the printed circuit board, the sealing member being a sheet; and a power control module to supply the power to the light emitting device module, wherein the sealing member directly contacts the upper surface and an upper portion of the lateral surface and extends downward while directly contacting the lateral surface of the light emitting device package, and wherein the sealing member extends from the upper portion of the lateral surface of the light emitting device package to a surface of the printed circuit board between the light emitting device package and another light emitting device package at a prescribed distance from a lower portion of the light emitting device package to form a prescribed space between the light emitting device package, the printed circuit board and the sealing member.

20. A light emitting device module comprising:

a light emitting device package having an upper surface and a lateral surface;

a printed circuit board on which the light emitting device package is arranged; and a sealing member that surrounds the light emitting device package and the printed circuit board, the sealing member being a sheet, wherein the sealing member directly contacts the upper surface and an upper portion of the lateral surface to cover the light emitting device package, wherein the sealing member extends from the upper portion of the lateral surface of the light emitting device package to a surface of the printed circuit board between the light emitting device package and another light emitting device package at a prescribed distance from the light emitting device package to form a prescribed space between the light emitting device package, the printed circuit board and the sealing member, and wherein the sheet has an outer surface facing away from the light emitting device package and an inner surface that faces the light emitting device package and directly contacting the light emitting device package, the outer surface and the inner surface being parallel to each other such that a shape of the outer surface corresponds to a shape of the inner surface.

\* \* \* \* \*